(12) United States Patent
Thompson et al.

(10) Patent No.: US 7,960,192 B2
(45) Date of Patent: *Jun. 14, 2011

(54) LIGHT EMITTING DEVICE HAVING SILICON-CONTAINING COMPOSITION AND METHOD OF MAKING SAME

(75) Inventors: David Scott Thompson, West Lakeland, MN (US); Larry D. Boardman, Woodbury, MN (US); Andrew J. Ouderkirk, Grange Garden (SG)

(73) Assignee: 3M Innovative Properties Company, St. Paul, MN (US)

( * ) Notice: Subject to any disclaimer, the term of this patent is extended or adjusted under 35 U.S.C. 154(b) by 453 days.

This patent is subject to a terminal disclaimer.

(21) Appl. No.: 11/855,524

(22) Filed: Sep. 14, 2007

(65) Prior Publication Data
US 2009/0076184 A1    Mar. 19, 2009

(51) Int. Cl.
*C08G 77/08* (2006.01)
*H01L 21/00* (2006.01)
*H01L 33/00* (2010.01)
*B32B 9/04* (2006.01)

(52) U.S. Cl. .............. 438/22; 438/26; 257/79; 428/447; 522/99; 522/172

(58) Field of Classification Search .............. 438/22, 438/26; 428/447; 522/99; 257/79
See application file for complete search history.

(56) References Cited

U.S. PATENT DOCUMENTS

| | | | |
|---|---|---|---|
| 2,823,218 A | 2/1958 | Speier et al. | |
| 3,220,972 A | 11/1965 | Lamoreaux | |
| 3,419,593 A | 12/1968 | Willing | |
| 3,445,420 A | 5/1969 | Kookootsedes et al. | |
| 3,715,334 A | 2/1973 | Karstedt | |
| 3,814,730 A | 6/1974 | Karstedt | |
| 3,989,666 A | 11/1976 | Niemi | |
| 3,989,667 A | 11/1976 | Lee et al. | |
| 4,256,870 A | 3/1981 | Eckberg | |
| 4,347,346 A | 8/1982 | Eckberg | |
| 4,421,903 A | 12/1983 | Ashby | |
| 4,504,645 A | 3/1985 | Melancon | |
| 4,510,094 A | 4/1985 | Drahnak | |
| 4,530,879 A | 7/1985 | Drahnak | |
| 4,585,669 A | 4/1986 | Eckberg | |
| 4,600,484 A | 7/1986 | Drahnak | |
| 4,609,574 A | 9/1986 | Keryk et al. | |
| 4,613,215 A | 9/1986 | Ayton | |
| 4,705,765 A | 11/1987 | Lewis | |

(Continued)

FOREIGN PATENT DOCUMENTS

EP    0 398 573    11/1990

OTHER PUBLICATIONS

U.S. Appl. No. 11/851,604, Title—Method of Making an LED Device Having a Dome Lens, filed Sep. 7, 2007.

*Primary Examiner* — Susan W Berman
(74) *Attorney, Agent, or Firm* — Elizabeth A. Gallo

(57) ABSTRACT

Disclosed herein is a light emitting device including an LED die and a photopolymerizable composition comprising a silicon-containing resin comprising silicon-bonded hydrogen and aliphatic unsaturation, and from about 0.5 to about 30 parts per million of a platinum catalyst. The photopolymerizable composition may be free of catalyst inhibitor. Also disclosed herein are methods of making the light emitting device.

15 Claims, 1 Drawing Sheet

U.S. PATENT DOCUMENTS

| | | |
|---|---|---|
| 4,774,111 A | 9/1988 | Lo |
| 4,916,169 A | 4/1990 | Boardman et al. |
| 5,063,102 A | 11/1991 | Lee et al. |
| 5,145,886 A | 9/1992 | Oxman et al. |
| 5,169,727 A | 12/1992 | Boardman |
| 5,313,365 A | 5/1994 | Pennisi et al. |
| 5,525,564 A | 6/1996 | McAfee et al. |
| 5,952,397 A | 9/1999 | Fujiki et al. |
| 6,046,250 A | 4/2000 | Boardman et al. |
| 6,099,783 A | 8/2000 | Scranton et al. |
| 6,150,546 A | 11/2000 | Butts |
| 6,376,569 B1 | 4/2002 | Oxman et al. |
| 6,451,869 B1 | 9/2002 | Butts |
| 6,806,509 B2 | 10/2004 | Yoshino |
| 6,908,682 B2 | 6/2005 | Mistele |
| 7,192,795 B2 * | 3/2007 | Boardman et al. .............. 438/22 |
| 7,202,320 B2 | 4/2007 | George et al. |
| 7,314,770 B2 | 1/2008 | Boardman et al. |
| 7,427,523 B2 * | 9/2008 | Boardman et al. .............. 438/22 |
| 7,595,515 B2 * | 9/2009 | Thompson et al. ........... 257/103 |
| 7,851,564 B2 * | 12/2010 | Murai et al. ................... 525/478 |
| 2003/0199603 A1 | 10/2003 | Walker et al. |
| 2004/0053059 A1 | 3/2004 | Mistele |
| 2004/0116640 A1 | 6/2004 | Miyoshi |
| 2005/0244649 A1 | 11/2005 | Kashiwagi |
| 2006/0157875 A1 | 7/2006 | Van Santen et al. |
| 2007/0092636 A1 | 4/2007 | Thompson et al. |
| 2007/0092736 A1 | 4/2007 | Boardman et al. |
| 2007/0092737 A1 | 4/2007 | Boardman et al. |
| 2007/0112147 A1 | 5/2007 | Morita et al. |
| 2007/0134425 A1 | 6/2007 | Morita et al. |
| 2007/0141739 A1 | 6/2007 | Thompson et al. |
| 2007/0269586 A1 | 11/2007 | Leatherdale et al. |
| 2007/0287208 A1 | 12/2007 | Thompson et al. |
| 2008/0079182 A1 | 4/2008 | Thompson et al. |

* cited by examiner

LIGHT EMITTING DEVICE HAVING SILICON-CONTAINING COMPOSITION AND METHOD OF MAKING SAME

FIELD

This disclosure relates to light emitting devices, and particularly, to light emitting devices including a light emitting diode (LED) and silicon-containing encapsulants formed by photopolymerization.

BACKGROUND

Typical encapsulants for LED devices are organic polymeric materials. Encapsulant lifetime is a significant hurdle holding back improved performance of high brightness LED devices. Conventional LED devices utilize epoxy resin encapsulants and, when is use, epoxy resins often yellow over time. This can reduce brightness and change the color rendering index of light emitted by the device. This is particularly important for white LED devices. The yellowing of the epoxy is believed to result from decomposition induced by high operating temperatures of the device and/or absorption of UV-blue light emitted therefrom.

A second problem that can occur when using conventional epoxy resins is stress-induced breakage of the wire bond on repeated thermal cycling. High brightness LED devices can have heat loads on the order of 100 Watts per square centimeter. Since the coefficients of thermal expansion of epoxy resins typically used as encapsulants are significantly larger than those of the semiconductor layers and the moduli of the epoxies can be high, the embedded wire bond can be stressed to the point of failure on repeated heating and cooling cycles.

Thus, there is a need for new photochemically stable and thermally stable encapsulants for LED devices that reduce the stress on the wire bond over many temperature cycles. In addition, there is a need for encapsulants that can be cured rapidly in order to accelerate manufacturing times and reduce overall LED cost.

SUMMARY

In one aspect, an LED device is disclosed herein, the LED device comprising an LED die and a photopolymerizable composition comprising: a silicon-containing resin comprising silicon-bonded hydrogen and aliphatic unsaturation, and from about 0.5 to about 30 parts per million of a platinum catalyst. The photopolymerizable composition may be free of catalyst inhibitor. In one embodiment, the silicon-containing resin comprises an organosiloxane. In another embodiment, the silicon-containing resin comprises a first organosiloxane having silicon-bonded hydrogen and a second organosiloxane having aliphatic unsaturation.

In another aspect, a method of making an LED device is disclosed herein, the method comprising: providing an LED die; providing a photopolymerizable composition comprising: a silicon-containing resin comprising silicon-bonded hydrogen and aliphatic unsaturation, and from about 10 to about 30 parts per million of a platinum catalyst; dispensing the photopolymerizable composition such that it is optically coupled to the LED die; and photopolymerizing the photopolymerizable composition by applying actinic radiation having a wavelength of 700 nm or less. Also described herein is a method utilizing a thermally polymerizable composition having from about 10 to about 30 parts per million of a platinum catalyst.

These and other aspects of the invention will be apparent from the detailed description and drawings below. In no event should the above summary be construed as a limitation on the claimed subject matter.

BRIEF DESCRIPTION OF DRAWINGS

The invention may be more completely understood in consideration of the detailed description in connection with the following figures.

DETAILED DESCRIPTION

Figure 1:
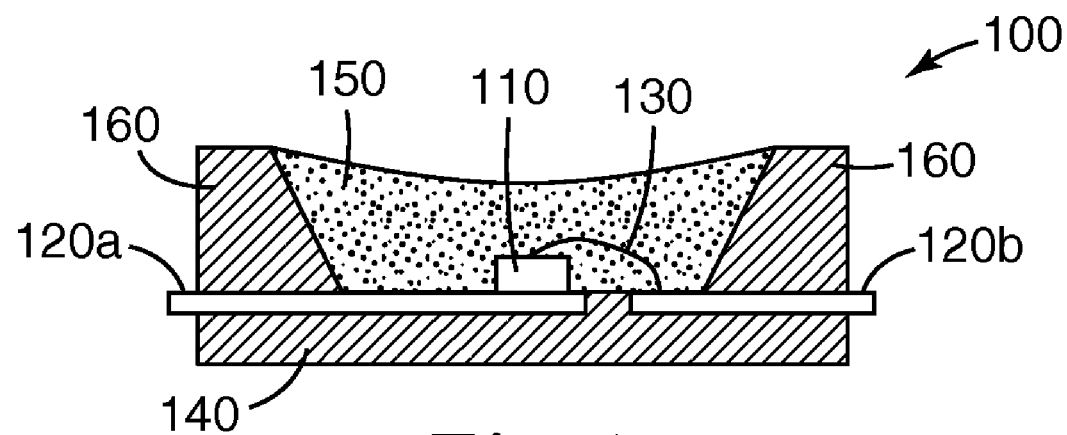
FIG. 1 is a schematic diagram of an LED device.

LED devices can be manufactured in a variety of configurations, many of which incorporate one or two conductive metal wires connecting the semiconductor die to electrodes on a substrate. FIG. 1 is a schematic diagram of a typical surface mount LED device 100. The LED die 110 is connected to electrode 120a and to electrode 120b by wire bond 130. The electrodes 120a and 120b are disposed on substrate 140, which together with sidewalls 160 form a reflecting cup. The LED die is encapsulated with encapsulant 150.

Light emitting devices comprising LED dice and photopolymerizable compositions used as encapsulants are known as described, for example, in U.S. Pat. No. 7,192,795 (Boardman et al.), U.S. Pat. Appl. Nos. 2006/0105481 A1 (Boardman et al.); 2007/0092736 A1 (Boardman et al.); and 2007/0092737 A1 (Boardman et al.); and U.S. Ser. No. 11/741,808 (Thompson et al.). In these references, the photopolymerizable compositions comprise silicon-containing resins that undergo metal-catalyzed hydrosilylation reactions between groups incorporating aliphatic unsaturation and silicon-bonded hydrogen which are bonded to the organosiloxane components. The photopolymerized compositions are especially useful as encapsulants for LED devices because they exhibit thermal and photochemical stability.

In the above references, the amount of metal-containing catalyst used in a given photopolymerizable composition is said to depend on a variety of factors such as the radiation source, whether or not heat is used, amount of time, temperature, etc., as well as on the particular chemistry of the silicon-containing resin(s), its reactivity, the amount present in the photopolymerizable composition, etc. In particular, it is pointed out that in some embodiments, the metal-containing catalyst may be used in an amount of at least 1 part per million (ppm) of the photopolymerizable composition. Further, it is said that the catalysts are included in amounts of no greater than 1000 parts of metal per one million parts of the photopolymerizable composition.

Figure 2:
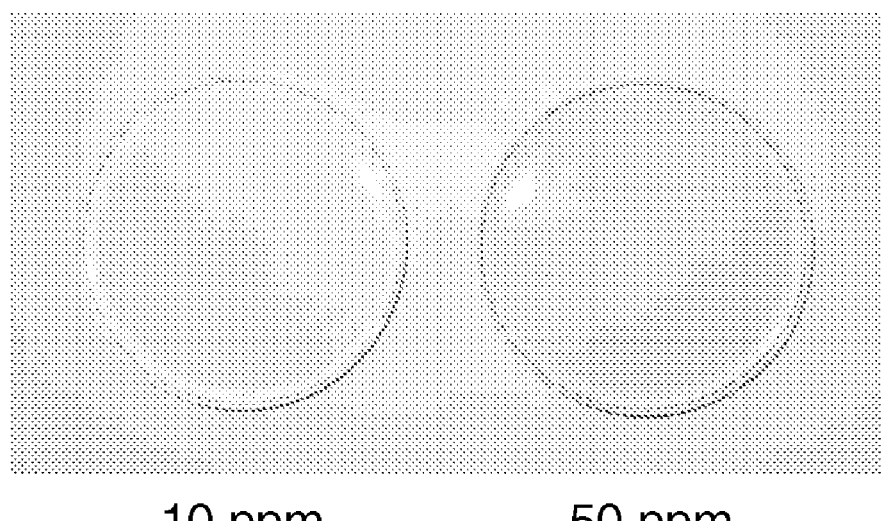
FIG. 2 is a photograph of exemplary and comparative silicone discs.

FIG. 2 is a photograph showing side-by-side comparision of two discs made from photopolymerizable compositions comprising silicon-containing resins. Hydrosilylation of components was carried out in the presence of 10 and 50 ppm, respectively, of a platinum catalyst. Details of the experimental procedures can be found in Example 1 and Comparative Example 1 for 10 and 50 ppm, respectively.

The photopolymerizable composition disclosed herein comprises organosiloxane components that are polymerized by metal-catalyzed hydrosilylation reactions between groups incorporating aliphatic unsaturation and silicon-bonded hydrogen, which are bonded to the organosiloxane components. Photopolymerization is carried out in the prescence of a metal-containing catalyst that can be activated by actinic radiation. The advantages of initiating hydrosilylation using catalysts activated by actinic radiation include (1) the ability to polymerize the photopolymerizable composition without subjecting the LED die, the substrate to which it is attached, or any other materials present in the package or system, to potentially harmful temperatures, (2) the ability to formulate one-part photopolymerizable compositions that display long working times (also known as bath life or shelf life), (3) the ability to polymerize the photopolymerizable composition on demand at the discretion of the user, and (4) the ability to simplify the formulation process by avoiding the need for two-part compositions as is typically required for thermally polymerizable hydrosilylation compositions.

The photopolymerizable composition can be photopolymerized using actinic radiation having a wavelength of less than or equal to 700 nm. Thus, the disclosed methods are particularly advantageous to the extent they avoid harmful temperatures. Preferably, the disclosed methods involve the application of actinic radiation at a temperature of less than 120° C., more preferably, at a temperature of less than 60° C., and still more preferably at a temperature of 25° C. or less.

Actinic radiation having a wavelength of 700 nm or less includes visible and UV light, but preferably, the actinic radiation has a wavelength of 600 nm or less, and more preferably from 200 to 600 nm, and even more preferably, from 250 to 500 nm. Preferably, the actinic radiation has a wavelength of at least 200 nm, and more preferably at least 250 nm.

A sufficient amount of actinic radiation is applied to the silicon-containing resin for a time to form an at least partially polymerized composition. A partially polymerized composition means that at least 5 mole percent of the aliphatic unsaturation is consumed in a hydrosilylation reaction. Preferably, a sufficient amount of the actinic radiation is applied to the silicon-containing resin for a time to form a substantially polymerized composition. A substantially polymerized composition means that greater than 60 mole percent of the aliphatic unsaturation present in the reactant species prior to reaction has been consumed as a result of the light activated addition reaction of the silicon-bonded hydrogen with the aliphatic unsaturated species. Preferably, such polymerization occurs in less than 30 minutes, more preferably in less than 10 minutes, and even more preferably in less than 5 minutes or less than 1 minute. In certain embodiments, such polymerization can occur in less than 10 seconds.

Examples of sources of actinic radiation include tungsten halogen lamps, xenon arc lamps, mercury arc lamps, incandescent lamps, germicidal lamps, fluorescent lamps, lasers, the LED die itself, or more than one LED die. There are a variety of possible UV sources that can be used to polymerize the silicon-containing material. One class is low intensity, low-pressure mercury bulbs. These include germicidal bulbs emitting primarily at 254 nm, Blacklight bulbs with peak emissions near 350 or 365 nm, and Blacklight Blue bulbs with emissions similar to Blacklight bulbs but using special glass to filter out light above 400 nm. Such systems are available from VWR, West Chester, Pa. Other classes include high intensity continuously emitting systems such as those available from Fusion UV Systems, Gaithersburg, Md.; high intensity pulsed emission systems such as those available from XENON Corporation Wilmington, Mass.; high intensity spot curing systems such as those available from LESCO Corporation Torrance, Calif.; and LED-based systems such as those available from UV Process Supply, Inc. Chicago, Ill. Laser systems may also be used for initiating polymerization in the photopolymerizable composition.

Actinic radiation may be applied to gel the silicon-containing resin and control settling of any additional components such as particles, phosphors, etc. which may be present in the photopolymerizable composition. Controlled settling of the particles or phosphors may be used to achieve specific useful spatial distributions of the particles or phosphors within the polymerized composition. For example, controlled settling of particles may enable formation of a gradient refractive index distribution that may enhance LED efficiency or emission pattern. It may also be advantageous to allow partial settling of phosphor such that a portion of the polymerized composition is clear and other portions contain phosphor. In this case, the clear portion of the polymerized composition can be shaped to act as a lens for the emitted light from the phosphor. Molding the photopolymerizable composition is described in U.S. Ser. No. 11/551,309 the disclosure of which is incorporated herein by reference.

The photopolymerizable composition may be heated after actinic radiation is applied. Heating may be carried out to control settling as described above, or it may be used to accelerate formation of the polymerized composition, or to decrease the amount of time the polymerized composition is exposed to actinic radiation during the previous step. Any heating means may be used such as an infrared lamp, a forced air oven, or a heating plate. If applied, heating may be at less than 150° C., or more preferably at less than 100° C., and still more preferably at less than 60° C. In one embodiment, the metal-containing catalyst comprises platinum. In another embodiment, the photopolymerizable composition may be at a temperature of from about 30° C. to about 120° C. In another embodiment, the metal-containing catalyst may comprise platinum, and the photopolymerizable composition may be at a temperature of from about 30° C. to about 120° C.

The photopolymerizable composition may be heated to a temperature of from about 30° C. to about 120° C. before actinic radiation is applied. Heating may be carried out in order to lower the viscosity of the photopolymerizable composition, for example, to facilitate the release of any entrapped gas. Heat may optionally be applied during or after application of the actinic radiation to accelerate formation of the polymerized composition.

The silicon-containing resin can include monomers, oligomers, polymers, or mixtures thereof. It includes silicon-bonded hydrogen and aliphatic unsaturation, which allows for hydrosilylation (i.e., the addition of a silicon-bonded hydrogen across a carbon-carbon double bond or triple bond). The silicon-bonded hydrogen and the aliphatic unsaturation may or may not be present in the same molecule. Furthermore, the aliphatic unsaturation may or may not be directly bonded to silicon.

Preferred silicon-containing resins are those that provide a polymerized composition, which can be in the form of a liquid, gel, elastomer, or a non-elastic solid, and are thermally and photochemically stable. For UV light, silicon-containing resins having refractive indices of at least 1.34 are preferred. For some embodiments, silicon-containing resins having refractive indices of at least 1.50 are preferred.

Preferred silicon-containing resins are selected such that they provide a polymerized composition that is photostable and thermally stable. Herein, photostable refers to a material that does not chemically degrade upon prolonged exposure to actinic radiation, particularly with respect to the formation of colored or light absorbing degradation products. Herein, thermally stable refers to a material that does not chemically degrade upon prolonged exposure to heat, particularly with respect to the formation of colored or light absorbing degradation products. In addition, preferred silicon-containing resins are those that possess relatively rapid cure mechanisms (e.g., seconds to less than 30 minutes) in order to accelerate manufacturing times and reduce overall LED cost.

In one embodiment, the silicon-containing resin comprises an organosiloxane (i.e., a silicone), which includes an organopolysiloxane. Such resins typically include at least two components, one having silicon-bonded hydrogen and one having aliphatic unsaturation. However, both silicon-bonded hydrogen and olefinic unsaturation may exist within the same molecule.

In one embodiment, the silicon-containing resin can include a silicone component having at least two sites of aliphatic unsaturation (e.g., alkenyl or alkynyl groups) bonded to silicon atoms in a molecule and an organohydrogensilane and/or organohydrogenpolysiloxane component having at least two hydrogen atoms bonded to silicon atoms in a molecule. Preferably, a silicon-containing resin includes both components, with the silicone containing aliphatic unsaturation as the base polymer (i.e., the major organosiloxane component in the composition.) Preferred silicon-containing resins are organopolysiloxanes. Such resins typically comprise at least two components, at least one of which contains aliphatic unsaturation and at least one of which contains silicon-bonded hydrogen. Polymerizable one component organopolysiloxane resins are possible if the single resin component contains both aliphatic unsaturation and silicon-bonded hydrogen.

Organopolysiloxanes that contain aliphatic unsaturation are preferably linear, cyclic, or branched organopolysiloxanes comprising units of the formula $R^1_a R^2_b SiO_{(4-a-b)/2}$ wherein: $R^1$ is a monovalent, straight-chained, branched or cyclic, unsubstituted or substituted hydrocarbon group that is free of aliphatic unsaturation and has from 1 to 18 carbon atoms; $R^2$ is a monovalent hydrocarbon group having aliphatic unsaturation and from 2 to 10 carbon atoms; a is 0, 1, 2, or 3; b is 0, 1, 2, or 3; and the sum a+b is 0, 1, 2, or 3; with the proviso that there is on average at least 1 $R^2$ present per molecule.

Organopolysiloxanes that contain aliphatic unsaturation preferably have an average viscosity of at least 5 mPa·s at 25° C.

Examples of suitable $R^1$ groups are alkyl groups such as methyl, ethyl, n-propyl, iso-propyl, n-butyl, iso-butyl, tert-butyl, n-pentyl, iso-pentyl, neo-pentyl, tert-pentyl, cyclopentyl, n-hexyl, cyclohexyl, n-octyl, 2,2,4-trimethylpentyl, n-decyl, n-dodecyl, and n-octadecyl; aromatic groups such as phenyl or naphthyl; alkaryl groups such as 4-tolyl; aralkyl groups such as benzyl, 1-phenylethyl, and 2-phenylethyl; and substituted alkyl groups such as 3,3,3-trifluoro-n-propyl, 1,1,2,2-tetrahydroperfluoro-n-hexyl, and 3-chloro-n-propyl. In one embodiment, at least 90 mole percent of the $R^1$ groups are methyl.

Examples of suitable $R^2$ groups are alkenyl groups such as vinyl, 5-hexenyl, 1-propenyl, allyl, 3-butenyl, 4-pentenyl, 7-octenyl, and 9-decenyl; and alkynyl groups such as ethynyl, propargyl and 1-propynyl. In the present invention, groups having aliphatic carbon-carbon multiple bonds include groups having cycloaliphatic carbon-carbon multiple bonds.

Organopolysiloxanes that contain silicon-bonded hydrogen are preferably linear, cyclic or branched organopolysiloxanes comprising units of the formula $R^1_a H_c SiO_{(4-a-c)/2}$ wherein: $R^1$ is as defined above; a is 0, 1, 2, or 3; c is 0, 1, or 2; and the sum of a+c is 0, 1, 2, or 3; with the proviso that there is on average at least 1 silicon-bonded hydrogen atom present per molecule. In one embodiment, at least 90 mole percent of the $R^1$ groups are methyl.

Organopolysiloxanes that contain silicon-bonded hydrogen preferably have an average viscosity of at least 5 mPa·s at 25° C.

Organopolysiloxanes that contain both aliphatic unsaturation and silicon-bonded hydrogen preferably comprise units of both formulae $R^1_a R^2_b SiO_{(4-a-b)/2}$ and $R^1_a H_c SiO_{(4-a-c)/2}$. In these formulae, $R^1$, $R^2$, a, b, and c are as defined above, with the proviso that there is an average of at least 1 group containing aliphatic unsaturation and 1 silicon-bonded hydrogen atom per molecule. In one embodiment, at least 90 mole percent of the $R^1$ groups are methyl.

The molar ratio of silicon-bonded hydrogen atoms to aliphatic unsaturation in the silicon-containing resin (particularly the organopolysiloxane resin) may range from 0.5 to 10.0 mol/mol, preferably from 0.8 to 4.0 mol/mol, and more preferably from 1.0 to 3.0 mol/mol.

For some embodiments, organopolysiloxane resins described above wherein a significant fraction of the $R^1$ groups are phenyl or other aryl, aralkyl, or alkaryl are preferred, because the incorporation of these groups provides materials having higher refractive indices than materials wherein all of the $R^1$ radicals are, for example, methyl.

The disclosed compositions also include a metal-containing catalyst which enables polymerization via radiation-activated hydrosilylation. These catalysts are known in the art and typically include complexes of precious metals such as platinum, rhodium, iridium, cobalt, nickel, and palladium. The precious metal-containing catalyst preferably contains platinum. Disclosed compositions can also include a cocatalyst, i.e., the use of two or more metal-containing catalysts.

A variety of such catalysts is disclosed, for example, in U.S. Pat. No. 7,192,795 (Boardman et al.) and references cited therein. Certain preferred platinum-containing catalysts are selected from the group consisting of Pt(II) β-diketonate complexes (such as those disclosed in U.S. Pat. No. 5,145,886 (Oxman et al.)), ($\eta^5$-cyclopentadienyl)tri(σ-aliphatic)platinum complexes (such as those disclosed in U.S. Pat. No. 4,916,169 (Boardman et al.) and U.S. Pat. No. 4,510,094 (Drahnak)), and $C_{7-20}$-aromatic substituted ($\eta^5$-cyclopentadienyl)tri(σ-aliphatic)platinum complexes (such as those disclosed in U.S. Pat. No. 6,150,546 (Butts)).

Such catalysts are used in an amount effective to accelerate the hydrosilylation reaction. In one embodiment, the photopolymerizable composition comprises from 0.5 to 30 ppm catalyst per one million parts of the photopolymerizable composition. In another embodiment, the photopolymerizable composition comprises 0.5 to 20 ppm catalyst per one million parts of the photopolymerizable composition. In another embodiment, the photopolymerizable composition comprises 0.5 to 12 ppm catalyst per one million parts of the photopolymerizable composition.

Photoinitiators can optionally be included in the composition to increase the overall rate of polymerization. Useful photoinitiators include, for example, monoketals of α-diketones or α-ketoaldehydes and acyloins and their corresponding ethers (such as those disclosed in U.S. Pat. No. 6,376,569 (Oxman et al.)). If used, such photoinitiators are preferably included in the composition in an amount of no greater than 50,000 parts by weight, and more preferably no greater than 5000 parts by weight, per one million parts of the composition. If used, such photoinitiators are preferably included in the composition in an amount of at least 50 parts by weight, and more preferably at least 100 parts by weight, per one million parts of the composition.

Catalyst inhibitors can optionally be included in the composition to further extend the usable shelf life of the composition. Catalyst inhibitors are known in the art and include such materials as acetylenic alcohols (for example, see U.S. Pat. No. 3,989,666 (Niemi) and U.S. Pat. No. 3,445,420 (Kookootsedes et al.)), unsaturated carboxylic esters (for example, see U.S. Pat. No. 4,504,645 (Melancon), U.S. Pat. No. 4,256,870 (Eckberg), U.S. Pat. No. 4,347,346 (Eckberg), and U.S. Pat. No. 4,774,111 (Lo)) and certain olefinic siloxanes (for example, see U.S. Pat. No. 3,933,880 (Bergstrom), U.S. Pat. No. 3,989,666 (Niemi), and U.S. Pat. No. 3,989,667 (Lee et al.)). If used, such catalyst inhibitors are preferably included in the composition in an amount not to exceed the amount of the metal-containing catalyst on a mole basis.

In one embodiment, the photopolymerizable composition is free of catalyst inhibitor. Minimization of the amounts of materials that can act as catalyst inhibitors can be desirable to maximize the cure speed of the photopolymerizable composition in that active hydrosilylation catalyst generated upon irradiation of the composition is produced in the absence of materials that can attenuate the activity of said active catalyst.

The photopolymerizable compositions can comprise one or more additives selected from the group consisting of nonabsorbing metal oxide particles, semiconductor particles, phosphors, sensitizers, antioxidants, pigments, and combinations thereof. If used, such additives are used in amounts to produced the desired effect.

Nonabsorbing metal oxide and semiconductor particles that are substantially transparent over the emission bandwidth of the LED device can be used. For example, a 1 mm thick disk of the nonabsorbing metal oxide and/or semiconductor particles mixed with photopolymerizable composition may absorb less than about 30% of the light incident on the disk. In other cases the mixture may absorb less than 10% of the light incident on the disk. Examples of nonabsorbing metal oxide and semiconductor particles include, but are not limited to, $Al_2O_3$, $ZrO_2$, $TiO_2$, $V_2O_5$, ZnO, $SnO_2$, ZnS, $SiO_2$, and mixtures thereof, as well as other sufficiently transparent non-oxide ceramic materials such as semiconductor materials including such materials as ZnS, CdS, and GaN. The particles can be surface treated to improve dispersibility in the photopolymerizable composition. Examples of such surface treatment chemistries include silanes, siloxanes, carboxylic acids, phosphonic acids, zirconates, titanates, and the like. Techniques for applying such surface treatment chemistries are known. Silica ($SiO_2$) has a relatively low refractive index but it may be useful in some applications, for example, as a thin surface treatment for particles made of higher refractive index materials, to allow for more facile surface treatment with organosilanes. In this regard, the particles can include species that have a core of one material on which is deposited a material of another type.

If used, the nonabsorbing metal oxide and semiconductor particles are preferably included in the photopolymerizable composition in an amount of no greater than 85 wt. %, based on the total weight of the photopolymerizable composition. Preferably, the nonabsorbing metal oxide and semiconductor particles are included in the composition in an amount of at least 10 wt. %, and more preferably in an amount of at least 45 wt. %, based on the total weight of the composition. Generally the particles can range in size from 1 nanometer to 1 micron, preferably from 10 nanometers to 300 nanometers, more preferably, from 10 nanometers to 100 nanometers. This particle size is an average particle size, wherein the particle size is the longest dimension of the particles, which is a diameter for spherical particles. It will be appreciated by those skilled in the art that the volume percent of metal oxide and/or semiconductor particles cannot exceed 74 percent by volume given a monomodal distribution of spherical particles.

Also disclosed herein is a method of making an LED device using a thermally polymerizable composition. The method comprises: providing an LED die; providing a thermally polymerizable composition comprising: a silicon-containing resin comprising silicon-bonded hydrogen and aliphatic unsaturation, and from about 0.5 to about 30 parts per million of a thermal platinum catalyst, wherein the polymerizable composition is free of catalyst inhibitor; and dispensing the thermally polymerizable composition such that it is optically coupled to the LED die. The method may further comprise polymerizing the polymerizable composition by applying heat. Useful silicon-containing resins include those described herein. Suitable thermal platinum catalysts that may be used include those disclosed, for example, in U.S. Pat. No. 2,823,218 (Speier et al), U.S. Pat. No. 3,419,593 (Willing), U.S. Pat. No. 3,715,334 and U.S. Pat. No. 3,814,730 (Karstedt), U.S. Pat. No. 4,421,903 (Ashby), U.S. Pat. No. 3,220,972 (Lamoreaux), U.S. Pat. No. 4,613,215 (Chandra et al), and U.S. Pat. No. 4,705,765 (Lewis). In some embodiments, the thermal platinum catalyst comprises a platinum vinylsiloxane complex.

"LED die", as used herein, refers to a diode that emits light, whether visible, ultraviolet, or infrared. It includes incoherent epoxy-encased semiconductor devices marketed as "LEDs", whether of the conventional or super-radiant variety. Vertical cavity surface emitting laser diodes are another form of LED die. An LED die is in its most basic form an individual component or chip made by semiconductor wafer processing procedures. The component or chip can include electrical contacts suitable for application of power to energize the device. The individual layers and other functional elements of the component or chip are typically formed on the wafer scale, the finished wafer finally being diced into individual piece parts to yield a multiplicity of LED dice.

The LED device disclosed herein includes monochrome and phosphor LED devices (in which blue or UV light is converted to another color via a fluorescent phosphor). In addition, the LED die can be packaged in a variety of configurations, including but not limited to those surface-mounted in ceramic or polymeric packages, which may or may not have a reflecting cup. Further, the LED die can be mounted on a circuit board or on a plastic electronic substrate. The LED can also include luminescent material that converts light emitted by the active region to other wavelengths. The luminescent material includes, for example, conventional phosphor particles, organic semiconductors, II-VI or III-V semiconductors, or II-VI or III-V quantum dots or nanocrystals, dies, or polymers.

The LED device disclosed herein may have any emission light that an LED die can emit and can range from the UV to the infrared portions of the electromagnetic spectrum depending on the composition and structure of the semiconductor layers. Where the source of the actinic radiation is the LED die itself, emission is preferably in the range from 350-500 nm.

In some embodiments, the LED die may be optically coupled to an optical element, for example, as described in U.S. Ser. No. 11/383,916 (Leatherdale et al.) and references cited therein. For example, the optical element may comprise a material having a refractive index of about 1.75 or greater such as glass, diamond, silicone carbide, sapphire, zirconia, zinc oxide, polymer, or a combination thereof. Optical elements made from these materials are sometimes referred to as extractors or optical concentrators because they can be made into optical elements that aid extraction of light from the LED die to the surrounding medium as well as to modify the emission pattern of the light. The optical element may also comprise an extractor or optical concentrator, such as any of those described in the aforementioned reference and references cited therein.

The optical element and the LED may be attached to each other in just about any relative configuration as long as they are optically coupled and the resulting light emitting device functions as desired. For example, the LED die may be optically coupled to the photopolymerizable composition, and the LED die may be optically coupled to the optical element such that the photopolymerizable composition contacts the optical element.

The photopolymerizable composition disclosed herein is resistant to thermal and photodegradation (resistant to yellowing) and thus is particularly useful for white light sources (i.e., white LED devices). White light sources include those that are direct emissive with white light generated by different colored LED dice, for example, a combination of red, green, and blue LED dice, or a combination of blue and yellow LED dice.

White light sources also include those that are phosphor-based light sources (PLEDs) wherein a single LED die generates light in a narrow range of wavelengths, and this light impinges upon and excites a phosphor material to produce visible light. The phosphor can comprise a mixture or combination of distinct phosphor materials, and the light emitted by the phosphor can include a plurality of narrow emission lines distributed over the visible wavelength range such that the emitted light appears substantially white to the unaided human eye. An example of a PLED device is a blue LED device illuminating a phosphor that converts blue to both red and green wavelengths. A portion of the blue excitation light is not absorbed by the phosphor, and the residual blue excitation light is combined with the red and green light emitted by the phosphor. Another example of a PLED device is an ultraviolet (UV) LED die illuminating a phosphor that absorbs and converts UV light to red, green, and blue light. Organopolysiloxanes where the $R^1$ groups are small and have minimal UV absorption, for example methyl, are preferred for UV light emitting diodes. It will be apparent to one skilled in the art that competitive absorption of the actinic radiation by the phosphor will decrease absorption by the photoinitiators slowing or even preventing polymerization if the system is not carefully constructed.

EXAMPLES

Experimental

An organosiloxane, silicone master batch, having aliphatic unsaturation and silicon-bonded hydrogen, was prepared by adding 500.0 g of Gelest VQM-135 (Gelest, Inc., Morrisville, Pa.) and 25.0 g of Dow Corning Syl-Off® 7678 (Dow Corning, Midland, Mich.) to a 1 liter glass bottle. Gelest VQM-135 is known as "vinyl Q resin" having a viscosity of 4500-7000 cSt and is also identified as "silicic acid, sodium salt, hydrolysis products with chlorotrimethylsilane and dichloroethenylmethylsilane" according to CAS 68584-83-8. Dow Corning Syl-Off® 7678 is known as a SiH crosslinker with component name "dimethyl, methylhydrogen siloxane" according to CAS 68037-59-2. A stock catalyst solution was prepared by dissolving 33 mg of MeCpPtMe$_3$ (Alfa Aesar, Ward Hill, Mass.) in 1 mL of toluene. Silicone compositions having different amounts of the platinum catalyst were prepared by combining master batch and catalyst solution as follows. All compositions were prepared under safe conditions where light below a wavelength of 500 nm was excluded.

Example 1

To a 100 mL amber jar was added 40.0 g of the silicone master batch and 20 µL of the catalyst solution (equivalent to 10 ppm platinum catalyst). The solution was mixed thoroughly with a metal spatula and was allowed to degas over several hours. Once the composition was degassed 6.2 g of the solution was poured into a plastic Petri dish having a diameter of 55 mm. The silicone solution was allowed to settle and was then cured by irradiation for 15 minutes under a UVP Blak-Ray Lamp Model XX-15L fitted with two 16 inch Philips TUV 15 W/G15 T8 Germicidal bulbs emitting primarily at 254 nm, followed by heating for 30 minutes at 80° C. in a forced air oven. The material cures to a tack-free solid in 1 to 2 minutes. The cured silicone disc was removed from the plastic Petri dish and was 2.7 mm in thickness at the center of the silicone disc. A transmission spectrum of the silicone was taken using a PerkinElmer Lambda 900 UV/VIS Spectrophotometer (PerkinElmer Instruments, Norwalk, Conn.). The transmission of the sample at 400 nm, not corrected for Fresnel reflections, was 93.8%. The sample was placed into a glass Petri dish to protect the surface from contamination by dust and debris and the sample was aged at 130° C. in a forced air oven for 1000 hours. Transmission data for the sample at 400 nm measured during the 1000 hour aging experiment are shown in Table 1. Transmission data for the sample at 460 nm measured during the 1000 hour aging experiment are shown in Table 3. Transmission data for the sample at 530 nm measured during the 1000 hour aging experiment are shown in Table 5. Transmission data for the sample at 670 nm measured during the 1000 hour aging experiment are shown in Table 7.

Example 2

To a 100 mL amber jar was added 40.0 g of the silicone master batch and 30 µL of the catalyst solution (equivalent to 15 ppm platinum catalyst). The solution was mixed thoroughly with a metal spatula and was allowed to degas over several hours. Once the composition was degassed 6.2 g of the solution was poured into a plastic Petri dish having a diameter of 55 mm. The silicone solution was allowed to settle and was then cured by irradiation for 15 minutes under a UVP Blak-Ray Lamp Model XX-15L fitted with two 16 inch Philips TUV 15 W/G15 T8 Germicidal bulbs emitting primarily at 254 nm, followed by heating for 30 minutes at 80° C. in a forced air oven. The cured silicone disc was removed from the plastic Petri dish and was 2.7 mm in thickness at the center of the silicone disc. A transmission spectrum of the silicone was taken using a PerkinElmer Lambda 900 UV/VIS Spectrophotometer (PerkinElmer Instruments, Norwalk, Conn.). The transmission of the sample at 400 nm, not corrected for Fresnel reflections, was 93.2%. The sample was placed into a glass Petri dish to protect the surface from contamination by dust and debris and the sample was aged at 130° C. in a forced air oven for 1000 hours. Transmission data for the sample at 400 nm measured during the 1000 hour aging experiment are shown in Table 1. Transmission data for the sample at 460 nm measured during the 1000 hour aging experiment are shown in Table 3. Transmission data for the sample at 530 nm measured during the 1000 hour aging experiment are shown in Table 5. Transmission data for the sample at 670 nm measured during the 1000 hour aging experiment are shown in Table 7.

Example 3

To a 100 mL amber jar was added 40.0 g of the silicone master batch and 40 µL of the catalyst solution (equivalent to 20 ppm platinum catalyst). The solution was mixed thoroughly with a metal spatula and was allowed to degas over several hours. Once the composition was degassed 6.2 g of the solution was poured into a plastic Petri dish having a diameter of 55 mm. The silicone solution was allowed to settle and was then cured by irradiation for 15 minutes under a UVP Blak-Ray Lamp Model XX-15L fitted with two 16 inch Philips TUV 15 W/G15 T8 Germicidal bulbs emitting primarily at 254 nm, followed by heating for 30 minutes at 80° C. in a forced air oven. The cured silicone disc was removed from the plastic Petri dish and was 2.7 mm in thickness at the center of the silicone disc. A transmission spectrum of the silicone was taken using a PerkinElmer Lambda 900 UV/VIS Spectrophotometer (PerkinElmer Instruments, Norwalk, Conn.). The transmission of the sample at 400 nm, not corrected for Fresnel reflections, was 92.6%. The sample was placed into a glass Petri dish to protect the surface from contamination by dust and debris and the sample was aged at 130° C. in a forced air oven for 1000 hours. Transmission data for the sample at 400 nm measured during the 1000 hour aging experiment are shown in Table 1. Transmission data for the sample at 460 nm measured during the 1000 hour aging experiment are shown in Table 3. Transmission data for the sample at 530 nm measured during the 1000 hour aging experiment are shown in Table 5. Transmission data for the sample at 670 nm measured during the 1000 hour aging experiment are shown in Table 7.

Example 4

To a 100 mL amber jar was added 20.0 g of the silicone master batch and 25 µL of the catalyst solution (equivalent to 25 ppm platinum catalyst). The solution was mixed thoroughly with a metal spatula and was allowed to degas over several hours. Once the composition was degassed 6.2 g of the solution was poured into a plastic Petri dish having a diameter of 55 mm. The silicone solution was allowed to settle and was then cured by irradiation for 15 minutes under a UVP Blak-Ray Lamp Model XX-15L fitted with two 16 inch Philips TUV 15 W/G15 T8 Germicidal bulbs emitting primarily at 254 nm, followed by heating for 30 minutes at 80° C. in a forced air oven. The cured silicone disc was removed from the plastic Petri dish and was 2.7 mm in thickness at the center of the silicone disc. A transmission spectrum of the silicone was taken using a PerkinElmer Lambda 900 UV/VIS Spectrophotometer (PerkinElmer Instruments, Norwalk, Conn.). The transmission of the sample at 400 nm, not corrected for Fresnel reflections, was 92.3%. The sample was placed into a glass Petri dish to protect the surface from contamination by dust and debris and the sample was aged at 130° C. in a forced air oven for 1000 hours. Transmission data for the sample at 400 nm measured during the 1000 hour aging experiment are shown in Table 1. Transmission data for the sample at 460 nm measured during the 1000 hour aging experiment are shown in Table 3. Transmission data for the sample at 530 nm measured during the 1000 hour aging experiment are shown in Table 5. Transmission data for the sample at 670 nm measured during the 1000 hour aging experiment are shown in Table 7. By extrapolation of the results from Examples 1-4, the composition containing 30 ppm platinum would be expected to have a percent transmission at 400 nm, after 1000 hours at 130° C., of at least about 85%.

Comparative Example 1

To a 100 mL amber jar was added 20.0 g of the silicone master batch and 50 µL of the catalyst solution (equivalent to 50 ppm platinum catalyst). The solution was mixed thoroughly with a metal spatula and was allowed to degas over several hours. Once the composition was degassed 6.2 g of the solution was poured into a plastic Petri dish having a diameter of 55 mm. The silicone solution was allowed to settle and was then cured by irradiation for 15 minutes under a UVP Blak-Ray Lamp Model XX-15L fitted with two 16 inch Philips TUV 15 W/G15 T8 Germicidal bulbs emitting primarily at 254 nm, followed by heating for 30 minutes at 80° C. in a forced air oven. The material cures to a tack-free solid in about 1 minute. The cured silicone disc was removed from the plastic Petri dish and was 2.7 mm in thickness at the center of the silicone disc. A transmission spectrum of the silicone was taken using a PerkinElmer Lambda 900 UV/VIS Spectrophotometer (PerkinElmer Instruments, Norwalk, Conn.). The transmission of the sample at 400 nm, not corrected for Fresnel reflections, was 88.9%. The sample was placed into a glass Petri dish to protect the surface from contamination by dust and debris and the sample was aged at 130° C. in a forced air oven for 1000 hours. Transmission data for the sample at 400 nm measured during the 1000 hour aging experiment are shown in Table 2. Transmission data for the sample at 460 nm measured during the 1000 hour aging experiment are shown in Table 4. Transmission data for the sample at 530 nm measured during the 1000 hour aging experiment are shown in Table 6. Transmission data for the sample at 670 nm measured during the 1000 hour aging experiment are shown in Table 8.

Comparative Example 2

To a 100 mL amber jar was added 20.0 g of the silicone master batch and 100 µL of the catalyst solution (equivalent to 100 ppm platinum catalyst). The solution was mixed thoroughly with a metal spatula and was allowed to degas over several hours. Once the composition was degassed 6.2 g of the solution was poured into a plastic Petri dish having a diameter of 55 mm. The silicone solution was allowed to settle and was then cured by irradiation for 15 minutes under a UVP Blak-Ray Lamp Model XX-15L fitted with two 16 inch Philips TUV 15 W/G15 T8 Germicidal bulbs emitting primarily at 254 nm, followed by heating for 30 minutes at 80° C. in a forced air oven. The cured silicone disc was removed from the plastic Petri dish and was 2.7 mm in thickness at the center of the silicone disc. A transmission spectrum of the silicone was taken using a PerkinElmer Lambda 900 UV/VIS Spectrophotometer (PerkinElmer Instruments, Norwalk, Conn.). The transmission of the sample at 400 nm, not corrected for Fresnel reflections, was 84.6%. The sample was placed into a glass Petri dish to protect the surface from contamination by dust and debris and the sample was aged at 130° C. in a forced air oven for 1000 hours. Transmission data for the sample at 400 nm measured during the 1000 hour aging experiment are shown in Table 2. Transmission data for the sample at 460 nm measured during the 1000 hour aging experiment are shown in Table 4. Transmission data for the sample at 530 nm measured during the 1000 hour aging experiment are shown in Table 6. Transmission data for the sample at 670 nm measured during the 1000 hour aging experiment are shown in Table 8.

Comparative Example 3

To a 100 mL amber jar was added 20.0 g of the silicone master batch and 200 µL of the catalyst solution (equivalent to 200 ppm platinum catalyst). The solution was mixed thoroughly with a metal spatula and was allowed to degas over several hours. Once the composition was degassed 6.2 g of the solution was poured into a plastic Petri dish having a diameter of 55 mm. The silicone solution was allowed to settle and was then cured by irradiation for 15 minutes under a UVP Blak-Ray Lamp Model XX-15L fitted with two 16 inch Philips TUV 15 W/G15 T8 Germicidal bulbs emitting primarily at 254 nm, followed by heating for 30 minutes at 80° C. in a forced air oven. The cured silicone disc was removed from the plastic Petri dish and was 2.7 mm in thickness at the center of the silicone disc. A transmission spectrum of the silicone was taken using a PerkinElmer Lambda 900 UV/VIS Spectrophotometer (PerkinElmer Instruments, Norwalk, Conn.). The transmission of the sample at 400 nm, not corrected for Fresnel reflections, was 79.4%. The sample was placed into a glass Petri dish to protect the surface from contamination by dust and debris and the sample was aged at 130° C. in a forced air oven for 1000 hours. Transmission data for the sample at 400 nm measured during the 1000 hour aging experiment are shown in Table 2. Transmission data for the sample at 460 nm measured during the 1000 hour aging experiment are shown in Table 4. Transmission data for the sample at 530 nm measured during the 1000 hour aging experiment are shown in Table 6. Transmission data for the sample at 670 nm measured during the 1000 hour aging experiment are shown in Table 8.

TABLE 1

| 130° C. Aging time (hours) | % Transmission at 400 nm (%) | | | |
|---|---|---|---|---|
| | Example 1 (10 ppm cat.) | Example 2 (15 ppm cat.) | Example 3 (20 ppm cat.) | Example 4 (25 ppm cat.) |
| 0 | 93.8 | 93.2 | 92.6 | 92.3 |
| 23 | 92.8 | 92.6 | 91.5 | 90.4 |
| 40 | 91.8 | 91.8 | 90.7 | 89.9 |
| 71 | 92.0 | 91.6 | 90.3 | 89.5 |
| 158 | 91.4 | 91.1 | 89.6 | 88.6 |
| 250 | 91.6 | 90.8 | 89.5 | 87.8 |
| 500 | 91.2 | 90.3 | 88.7 | 87.5 |
| 775 | 90.5 | 89.7 | 88.5 | 87.2 |
| 1000 | 90.4 | 89.8 | 88.4 | 87.2 |

TABLE 2

| 130° C. Aging time (hours) | % Transmission at 400 nm | | |
|---|---|---|---|
| | Comparative Ex. 1 (50 ppm cat.) | Comparative Ex. 2 (100 ppm cat.) | Comparative Ex. 3 (200 ppm cat.) |
| 0 | 88.9 | 84.6 | 79.4 |
| 23 | 84.6 | 75.1 | 56.5 |
| 40 | 84.1 | 74.8 | 56.4 |
| 71 | 82.6 | 72.4 | 54.7 |
| 158 | 81.7 | 71.3 | 53.4 |
| 250 | 81.3 | 71.1 | 53.7 |
| 500 | 81.2 | 71.0 | 52.9 |
| 775 | 81.0 | 70.5 | 52.2 |
| 1000 | 80.7 | 70.0 | 53.0 |

TABLE 3

| 130° C. Aging time (hours) | % Transmission at 460 nm | | | |
|---|---|---|---|---|
| | Example 1 (10 ppm cat.) | Example 2 (15 ppm cat.) | Example 3 (20 ppm cat.) | Example 4 (25 ppm cat.) |
| 0 | 94.4 | 94.3 | 94.3 | 94.3 |
| 23 | 93.3 | 93.7 | 92.9 | 91.9 |
| 40 | 92.7 | 92.9 | 92.1 | 91.6 |
| 71 | 92.6 | 92.6 | 91.8 | 91.3 |
| 158 | 92.3 | 92.5 | 91.3 | 90.7 |
| 250 | 92.5 | 92.0 | 91.1 | 89.8 |
| 500 | 92.3 | 91.5 | 90.5 | 89.6 |
| 775 | 91.6 | 91.3 | 90.2 | 89.4 |
| 1000 | 91.5 | 91.4 | 90.3 | 89.3 |

TABLE 4

| 130° C. Aging time (hours) | % Transmission at 460 nm | | |
|---|---|---|---|
| | Comparative Ex. 1 (50 ppm cat.) | Comparative Ex. 2 (100 ppm cat.) | Comparative Ex. 3 (200 ppm cat.) |
| 0 | 93.6 | 92.4 | 91.0 |
| 23 | 87.9 | 81.0 | 66.7 |
| 40 | 87.0 | 79.9 | 65.3 |
| 71 | 86.1 | 78.3 | 64.5 |
| 158 | 85.4 | 77.4 | 63.0 |
| 250 | 84.9 | 77.1 | 63.0 |
| 500 | 84.8 | 77.0 | 62.1 |
| 775 | 84.7 | 76.5 | 61.4 |
| 1000 | 84.5 | 76.1 | 62.1 |

TABLE 5

| 130° C. Aging time (hours) | % Transmission at 530 nm | | | |
|---|---|---|---|---|
| | Example 1 (10 ppm cat.) | Example 2 (15 ppm cat.) | Example 3 (20 ppm cat.) | Example 4 (25 ppm cat.) |
| 0 | 94.5 | 94.6 | 94.6 | 94.6 |
| 23 | 93.6 | 94.1 | 93.4 | 92.9 |
| 40 | 93.0 | 93.4 | 92.9 | 92.5 |
| 71 | 93.1 | 93.2 | 92.6 | 92.3 |
| 158 | 92.7 | 93.3 | 92.3 | 91.8 |
| 250 | 93.1 | 92.9 | 92.2 | 91.3 |
| 500 | 92.8 | 92.5 | 91.6 | 91.0 |
| 775 | 92.4 | 92.4 | 91.7 | 91.0 |
| 1000 | 92.2 | 92.4 | 91.6 | 90.8 |

TABLE 6

| 130° C. Aging time (hours) | % Transmission at 530 nm | | |
|---|---|---|---|
| | Comparative Ex. 1 (50 ppm cat.) | Comparative Ex. 2 (100 ppm cat.) | Comparative Ex. 3 (200 ppm cat.) |
| 0 | 94.4 | 94.2 | 93.9 |
| 23 | 89.9 | 85.1 | 74.5 |
| 40 | 89.1 | 84.1 | 73.0 |
| 71 | 88.5 | 82.8 | 72.2 |
| 158 | 87.9 | 82.0 | 70.7 |
| 250 | 87.4 | 81.7 | 70.7 |
| 500 | 87.4 | 81.6 | 69.8 |
| 775 | 87.5 | 81.2 | 69.2 |
| 1000 | 87.2 | 80.8 | 69.8 |

TABLE 7

| 130° C. Aging time (hours) | % Transmission at 670 nm | | | |
|---|---|---|---|---|
| | Example 1 (10 ppm cat.) | Example 2 (15 ppm cat.) | Example 3 (20 ppm cat.) | Example 4 (25 ppm cat.) |
| 0 | 94.5 | 94.5 | 94.5 | 94.6 |
| 23 | 93.6 | 94.2 | 93.9 | 93.5 |
| 40 | 93.2 | 93.8 | 93.6 | 93.4 |
| 71 | 93.6 | 93.8 | 93.6 | 93.5 |
| 158 | 93.3 | 93.9 | 93.3 | 93.0 |
| 250 | 93.4 | 93.7 | 93.2 | 92.7 |
| 500 | 93.3 | 93.3 | 92.8 | 92.5 |
| 775 | 92.7 | 93.1 | 92.8 | 92.5 |
| 1000 | 92.6 | 93.2 | 92.7 | 92.4 |

TABLE 8

| 130° C. Aging time (hours) | % Transmission at 670 nm | | |
|---|---|---|---|
| | Comparative Ex. 1 (50 ppm cat.) | Comparative Ex. 2 (100 ppm cat.) | Comparative Ex. 3 (200 ppm cat.) |
| 0 | 94.4 | 94.4 | 94.4 |
| 23 | 92.2 | 89.7 | 83.9 |
| 40 | 91.7 | 89.1 | 82.8 |
| 71 | 91.5 | 88.3 | 82.3 |
| 158 | 91.0 | 87.7 | 81.0 |
| 250 | 90.5 | 87.3 | 80.8 |
| 500 | 90.7 | 87.3 | 80.3 |
| 775 | 90.7 | 87.0 | 79.8 |
| 1000 | 90.5 | 86.8 | 80.2 |

Various modifications and alterations to the invention will become apparent to those skilled in the art without departing from the scope and spirit of the invention.

What is claimed is:

1. An light emitting device (LED) device comprising:
an LED die; and
a photopolymerizable composition comprising:
a silicon-containing resin comprising silicon-bonded hydrogen and aliphatic unsaturation, and
from 10 to about 30 parts per million of a platinum catalyst,
wherein the photopolymerizable composition has been photopolymerized.

2. The LED device of claim 1, wherein the photopolymerizable composition is free of catalyst inhibitor.

3. The LED device of claim 1, wherein the silicon-containing resin comprises an organosiloxane.

4. The LED device of claim 1, wherein the silicon-containing resin comprises a first organosiloxane having units of the formula:

$$R^1_a H_c SiO_{(4-a-c)/2}$$

wherein:
$R^1$ is a monovalent, straight-chained, branched or cyclic, unsubstituted or substituted, hydrocarbon group that is free of aliphatic unsaturation and has from 1 to 18 carbon atoms;
a is 0, 1, 2, or 3;
c is 0, 1, or 2; and
the sum of a+c is 0, 1, 2, or 3;
with the proviso that there is on average at least one silicon-bonded hydrogen present per molecule.

5. The LED device of claim 4, wherein at least 90 mole percent of the $R^1$ groups are methyl.

6. The LED device of claim 1, wherein the silicon-containing resin comprises a second organosiloxane, the second organosiloxane having units of the formula:

$$R^1_a R^2_b SiO_{(4-a-b)/2}$$

wherein:
$R^1$ is a monovalent, straight-chained, branched or cyclic, unsubstituted or substituted, hydrocarbon group that is free of aliphatic unsaturation and has from 1 to 18 carbon atoms;
$R^2$ is a monovalent hydrocarbon group having aliphatic unsaturation and from 2 to 10 carbon atoms;
a is 0, 1, 2, or 3;
b is 0, 1, 2, or 3; and
the sum a+b is 0, 1, 2, or 3;
with the proviso that there is on average at least one $R^2$ present per molecule.

7. The LED device of claim 6, wherein at least 90 mole percent of the $R^1$ groups are methyl.

8. A method of making an LED device, comprising:
providing an LED die;
providing a photopolymerizable composition comprising:
a silicon-containing resin comprising silicon-bonded hydrogen and aliphatic unsaturation, and
from 10 to about 30 parts per million of a platinum catalyst; and
dispensing the photopolymerizable composition such that it is optically coupled to the LED die; and
photopolymerizing the photopolymerizable composition by applying actinic radiation having a wavelength of 700 nm or less.

9. The method of claim 8, wherein the photopolymerizable composition is free of catalyst inhibitor.

10. An LED device prepared according to the method of claim 9.

11. An LED device prepared according to the method of claim 8.

12. The LED device of claim 11, wherein at 400 nm and after 1000 hours at 130° C., the LED device exhibits at least about 85% transmission relative to the LED device before 1000 hours at 130° C.

13. A method of making an LED device, comprising:
providing an LED die;
providing a thermally polymerizable composition comprising:
a silicon-containing resin comprising silicon-bonded hydrogen and aliphatic unsaturation, and
from about 10 to about 30 parts per million of a thermal platinum catalyst,
wherein the polymerizable composition is free of catalyst inhibitor;
dispensing the thermally polymerizable composition such that it is optically coupled to the LED die; and
polymerizing the polymerizable composition by applying heat.

14. The LED device prepared according to the method of claim 13.

15. The LED device of claim 14, wherein at 400 nm and after 1000 hours at 130° C., the LED device exhibits at least about 85% transmission relative to the LED device before 1000 hours at 130° C.

* * * * *

UNITED STATES PATENT AND TRADEMARK OFFICE
CERTIFICATE OF CORRECTION

| | | |
|---|---|---|
| PATENT NO. | : 7,960,192 B2 | Page 1 of 1 |
| APPLICATION NO. | : 11/855524 | |
| DATED | : June 14, 2011 | |
| INVENTOR(S) | : David Scott Thompson | |

It is certified that error appears in the above-identified patent and that said Letters Patent is hereby corrected as shown below:

Column 16,
Line 27, in Claim 8, after "catalyst;" delete "and".

Signed and Sealed this
Twenty-seventh Day of September, 2011

David J. Kappos
*Director of the United States Patent and Trademark Office*